(12) United States Patent
Choi

(10) Patent No.: US 6,734,721 B1
(45) Date of Patent: May 11, 2004

(54) METHOD AND APPARATUS FOR AFFECTING SPEED OF TRANSITION OF A CLOSED LOOP CIRCUIT

(75) Inventor: Davy H. Choi, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/352,350

(22) Filed: Jan. 27, 2003

(51) Int. Cl.$^7$ ................................................ H03F 3/45
(52) U.S. Cl. ........................................ 327/560; 330/258
(58) Field of Search ................................ 327/560, 561, 327/562, 563; 330/258, 260, 252

(56) References Cited

U.S. PATENT DOCUMENTS 5,381,114 A * 1/1995 Pena-Finol et al. ......... 330/258
5,986,502 A * 11/1999 Nakamura .................. 330/258
6,043,702 A * 3/2000 Singh .......................... 327/534

* cited by examiner

Primary Examiner—Dinh T. Le
(74) Attorney, Agent, or Firm—W. Daniel Swayze, Jr.; W. James Brady; Frederick J. Telecky, Jr.

(57) ABSTRACT

A method for affecting speed of transition of a closed loop circuit from an initial state to a steady state during a transition period; the closed loop circuit including a switching unit effecting the transition in response to a gating signal applied to a gate locus at a value greater than a predetermined threshold potential; includes the steps of: (a) at least one of: (1) clamping the gate locus at a minimum potential greater than ground potential and less than the predetermined threshold potential; and (2) increasing potential at the gate locus at a plurality of various rates during a plurality of segments of the transition period.

13 Claims, 5 Drawing Sheets

METHOD AND APPARATUS FOR AFFECTING SPEED OF TRANSITION OF A CLOSED LOOP CIRCUIT

BACKGROUND OF THE INVENTION

The present invention is directed to electrical circuits known as closed-loop circuits. By way of example and not by way of limitation, a common-mode feedback loop is described herein as an exemplary embodiment of such a closed-loop circuit. One skilled in the art will easily recognize that the method and apparatus of the present invention may be advantageously employed with other closed-loop circuits.

A critical design consideration of closed-loop circuits is to ensure that the circuits are stable. A common criterion of stability is to design a loop so that its open loop phase margin is sufficiently large. A typical such design consideration is to ensure that open loop phase margin is >45°. It is particularly desirable to have open loop phase margin be in the range of 60°–90°.

Phase margin ($\Phi_M$) is inversely proportional to loop bandwidth (LBW). Settling time $T_S$ of a loop circuit is also inversely proportional to LBW. Thus, there is a trade off between $\Phi_M$ and $T_S$. A smaller LBW gives a higher $\Phi_M$ at the expense of a longer $T_S$. A larger LBW may also be established with a shorter $T_S$, but with a lesser $\Phi_M$.

There is a need for a method and apparatus for affecting speed of transition of a closed loop circuit from an initial state to a steady state that improves settling time $T_S$ while maintaining phase margin $\Phi_M$ at an acceptable value.

SUMMARY OF THE INVENTION

A method for affecting speed of transition of a closed loop circuit from an initial state to a steady state during a transition period; the closed loop circuit including a switching unit effecting the transition in response to a gating signal applied to a gate locus at a value greater than a predetermined threshold potential; includes the steps of: (a) at least one of: (1) clamping the gate locus at a minimum potential greater than ground potential and less than the predetermined threshold potential; and (2) increasing potential at the gate locus at a plurality of various rates during a plurality of segments of the transition period.

An apparatus for affecting speed of transition of a closed loop circuit from an initial state to a steady state during a transition period; the closed loop circuit including a switching unit effecting the transition in response to a gating signal applied to a gate locus at a value greater than a predetermined threshold potential; comprises: (a) at least one of: (1) a clamping means coupled with the gate locus for clamping the gate locus at a minimum potential greater than ground potential and less than the predetermined threshold potential; and (2) a potential controlling means coupled with the gate locus for increasing potential at the gate locus at a plurality of various rates during a plurality of segments of the transition period.

It is, therefore, an object of the present invention to provide a method and apparatus for affecting speed of transition of a closed loop circuit from an initial state to a steady state that improves settling time $T_S$ while maintaining phase margin $\Phi_M$ at an acceptable value.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
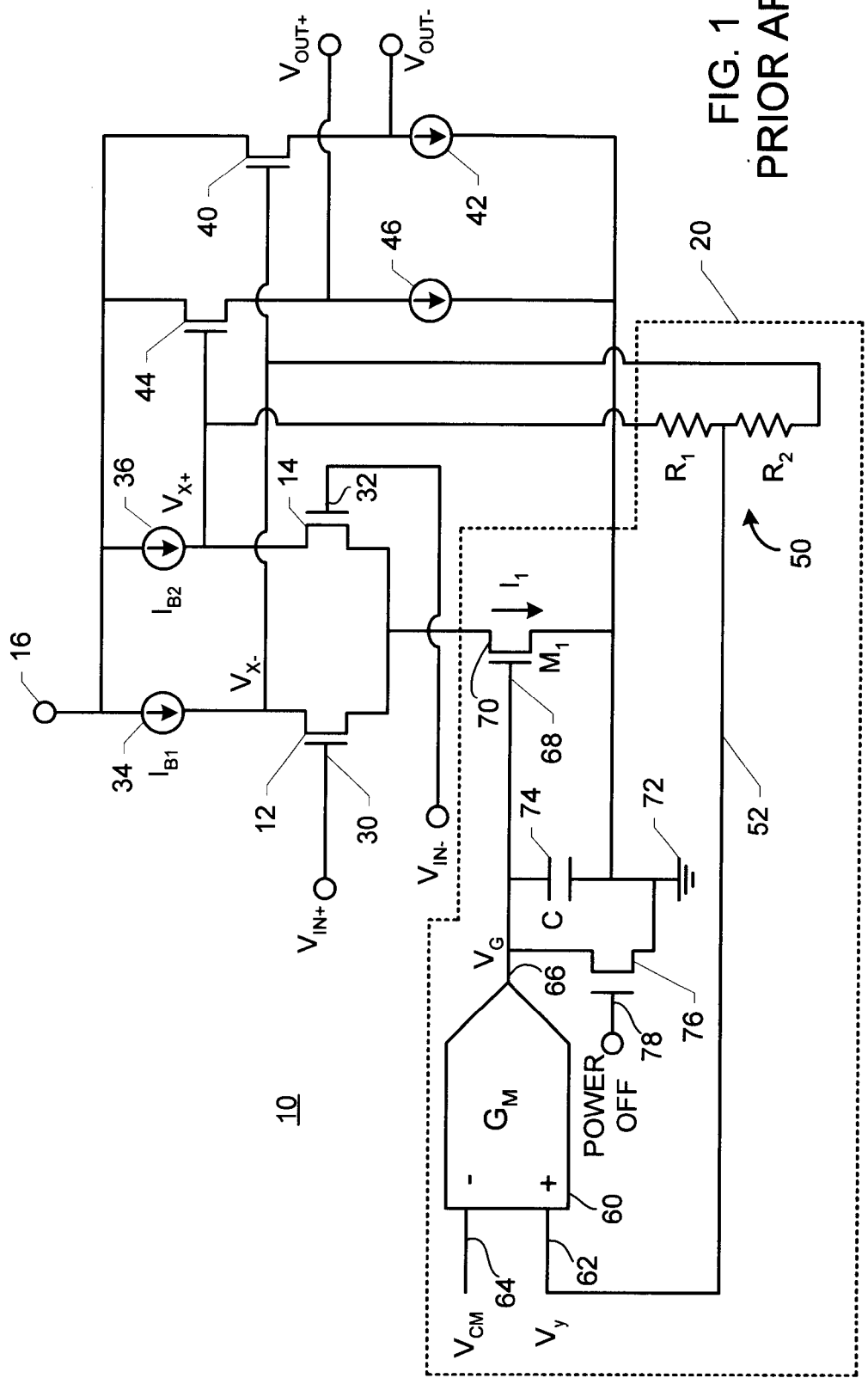
FIG. 1 is an electrical schematic diagram of a differential amplifier device including an exemplary prior art common-mode feedback loop.

FIG. 1 is an electrical schematic diagram of a differential amplifier device including an exemplary prior art common-mode feedback loop. In FIG. 1, a differential amplifier device 10 includes parallel-connected input switching transistors 12, 14 coupled between a supply signal locus 16 and a closed loop feedback circuit 20. Input switching transistor 12 is gated at a gate locus 30 by an input signal $V_{IN+}$ and is coupled with a current source 34 that generates a bias current $I_{B1}$. Input switching transistor 14 is gated at a gate locus 32 by an input signal $V_{IN-}$ and is coupled with a current source 36 that generates a bias current $I_{B2}$. Base potential $V_{X-}$ of input switching transistor 12 gates a switching transistor 40 to switchingly affect current flow through switching transistor 40 established by a current source 42, thereby controlling output voltage $V_{OUT-}$. Base potential $V_{X+}$ of input switching transistor 14 gates a switching transistor 44 to switchingly affect current flow through switching transistor 44 established by a current source 46, thereby controlling output voltage $V_{OUT+}$.

Because base potentials $V_{X+}$, $V_{X-}$ are produced at high impedance nodes, their respective direct current (DC) bias voltages are a function of supply voltage applied at supply signal locus 16, manufacturing process variables in manufacturing components of differential amplifier device 10 and ambient temperatures extant when operating differential amplifier device 10. Closed loop feedback circuit 20 (illustrated in FIG. 1 in an exemplary common mode feedback loop circuit) is employed to overcome dependency of base potentials $V_{X+}$, $V_{X-}$ upon such factors.

Closed loop feedback circuit 20 includes a voltage divider element 50 that includes resistors $R_1$, $R_2$. Resistors $R_1$, $R_2$ are preferably substantially equal in value and arranged to receive base potentials $V_{X+}$, $V_{X-}$ appropriately to present a signal $V_Y$ on a line 52 that is substantially equal to:

$$V_Y = \frac{1}{2}(V_{X+} + V_{X-}) \quad [1]$$

Closed loop feedback circuit 20 also includes a functional block 60 that receives signal $V_Y$ at a first input locus 62 and receives a common mode voltage input $V_{CM}$ at a second input locus 64. Functional block 60 has a transconductance of $G_m$. Functional block 60 presents an output signal at an output locus 66 that is applied to a gate locus 68 of a loop switching transistor 70 as a gating voltage $V_G$. Loop switching transistor 70 is coupled between input switching transistors 12, 14 and ground at a ground locus 72, thereby controlling current flow through input switching transistors 12, 14. A capacitor 74 is coupled between gate locus 68 and a ground locus 72. A shut down switching transistor 76 is coupled between output locus 66 of functional block 60 and ground locus 72. Shut down switching transistor 76 responds to a POWER OFF signal applied to a gate locus 78 for switchingly controlling coupling of output locus 66 with ground locus 72.

Before differential amplifier device 10 is initially powered up, POWER OFF signal is present at gate locus 78 of shut down switching transistor 76. POWER OFF signal is high, thereby turning on shut down switching transistor 76 to couple output locus 66 with ground locus 72. This establishes ground as the initiation point for gating voltage $V_G$ for subsequent start up of differential amplifier device 10. This initialization of gating voltage $V_G$ at ground potential for start up ensures proper start up of differential amplifier device 10 in order to avoid introducing overshoot or ringing or other instability during start up operations. For normal operation, POWER OFF is switched low which turns off shut down switching transistor device 76, thereby permitting gating voltage $V_G$ to vary from ground potential.

Closed loop feedback circuit 20 compares $V_Y$ with $V_{CM}$, and adjusts $V_G$ until $V_Y=V_{CM}$. Specifically, $$V_G = \frac{G_m(V_Y - V_{CM})}{sC} \quad [2]$$

Where, s is a LaPlace Transform function in the frequency domain;

C is the load capacitance represented by capacitor 74; and

Gm is the transconductance of functional block 60.

Thus, $V_G$, as expressed in Eqn. [2] is the integrated, or low-pass filtered value of $(V_Y-V_{CM})$. If $V_Y>V_{CM}$, the value of $V_G$ will increase to cause more current $I_1$ to flow through loop switching transistor 70. As a consequence, greater currents $I_{B1}$, $I_{B2}$ flow through input switching transistors 12,14 thereby moving base potentials $V_{X+}$, $V_{X-}$ lower until an equilibrium state is reached when $V_Y=V_{CM}$.

As mentioned earlier herein, an important design consideration for closed loop circuits is to ensure that the loop is stable. A common stability criterion is to design a loop so that its open loop phase margin $\Phi_M$ is sufficiently large, preferably >45°, and most preferably established at $60° \leq \Phi_M \leq 90°$. In general, phase margin $\Phi_M$ is inversely proportional to the loop bandwidth (LBW) of a loop circuit. However, settling time $T_S$ of the loop circuit is also inversely proportional to LBW of the loop circuit. Thus, there is a trade off between phase margin $\Phi_M$ and settling time $T_S$ for a given loop circuit. That is, a small LBW gives a higher phase margin $\Phi_M$ at the expense of a longer settling time $T_S$, and a larger LBW gives a lower phase margin $\Phi_M$ with an attendant shorter settling time $T_S$.

In exemplary prior art closed loop feedback circuit 20 (FIG. 1) LBW is largely determined by the value of $G_m/C$, where $G_m$ is the transconductance of functional block 60 and C is the capacitance value of capacitor 74. Imposing a maximum value of $G_m/C$ yields a maximum LBW while delivering a minimum phase margin $\Phi_M$. In attempting to speed up loop response for closed loop feedback circuit 20 (FIG. 1), that is reducing settling time $T_S$, one may try increasing $G_m$. However, in doing so phase margin $\Phi_M$ decreases. In order to raise phase margin to an acceptable value, one may increase capacitance C, but that adjustment returns settling time $T_S$ to substantially its original value. That is, there is substantially a one-to-one mapping between phase margin $\Phi_M$ and settling time $T_S$.

Figure 2:
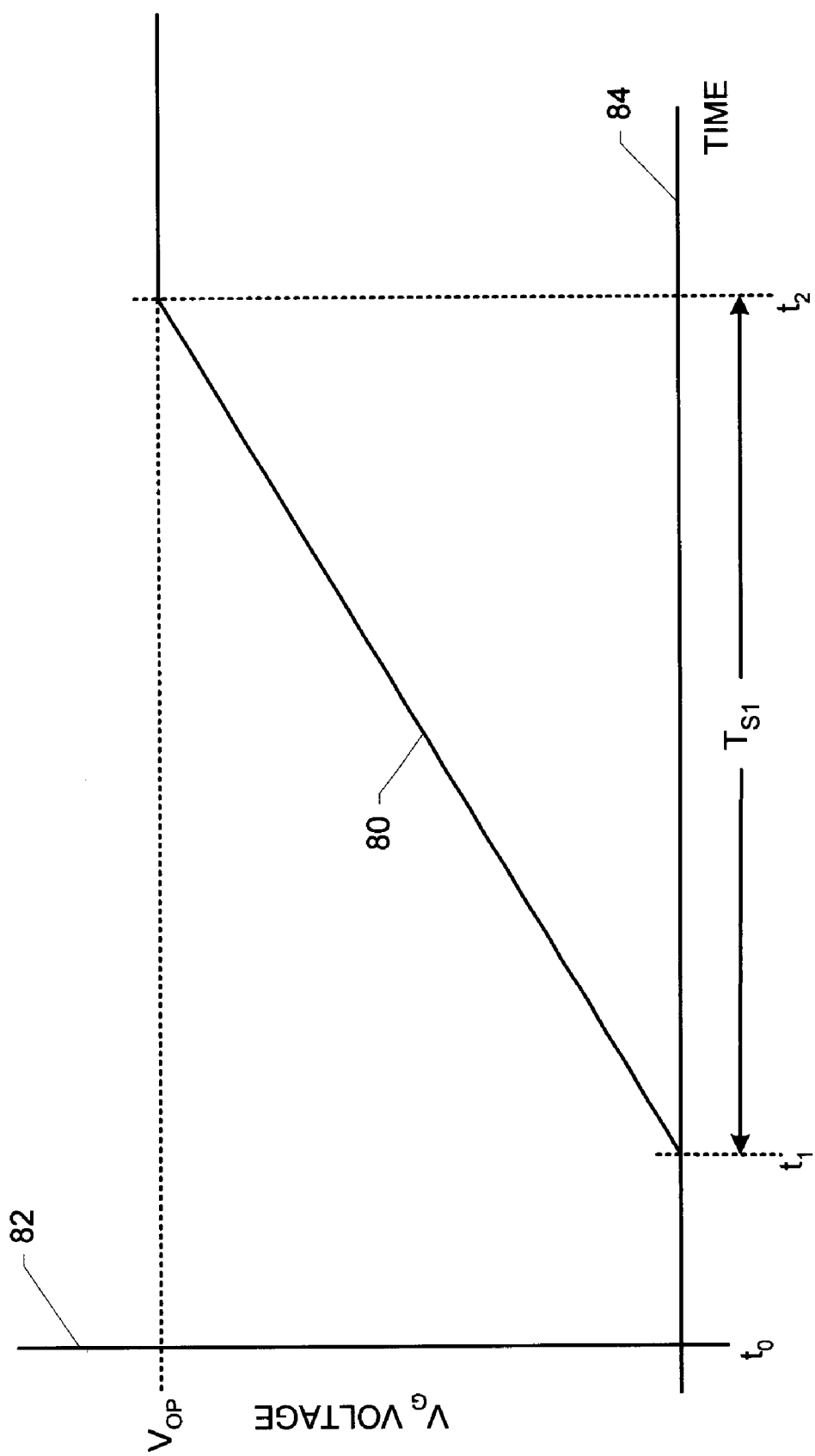
FIG. 2 is a graphical representation of gate voltage as a function of time in the prior art common-mode feedback loop of FIG. 1.

FIG. 2 is a graphical representation of gate voltage as a function of time in the prior art common-mode feedback loop of FIG. 1. In FIG. 2, a response curve 80 is plotted against a first axis 82, representing gate voltage $V_G$ as a function of time, represented on a second axis 84. Gate voltage $V_G$ is maintained at substantially zero volts (i.e., substantially at ground) during an interval $t_0-t_1$. For example, during the interval $t_0-t_1$, shut down switching transistor 76 (FIG. 1) is turned on and output locus 66 of fictional block 60 is coupled with ground locus 72. At time $t_1$, shut down switching transistor 76 is turned off and gate voltage $V_G$ from output locus 66 of functional block 60 begins to increase. At a time $t_2$, gate voltage $V_G$ reaches an operating voltage level $V_{OP}$ at which steady state operations are continued. The interval $t_1-t_2$ is the settling time $T_{S1}$ for a prior art closed loop circuit such as closed loop feedback circuit 20 (FIG. 1) responding as illustrated in FIG. 2.

The present invention involves two techniques—manifested in method steps and in apparatuses for carrying out those method steps—for reducing settling time $T_S$ without significantly affecting phase margin $\Phi_M$. The techniques, which may be used individually or may be employed together, are (explained in terms of representative closed loop feedback circuit 20; FIG. 1):

1. Clamp the gate of the loop switching transistor 70 at a potential higher than ground potential but less than the threshold gating potential at which loop switching transistor 70 begins to conduct; and
2. Speed up gate voltage $V_G$ ramp momentarily without affecting steady state stability of the loop circuit. This is preferably accomplished by increasing the slope of the gate voltage $V_G$ response curve during the period before operating voltage $V_{OP}$ is attained for steady state operations.

Figure 3:
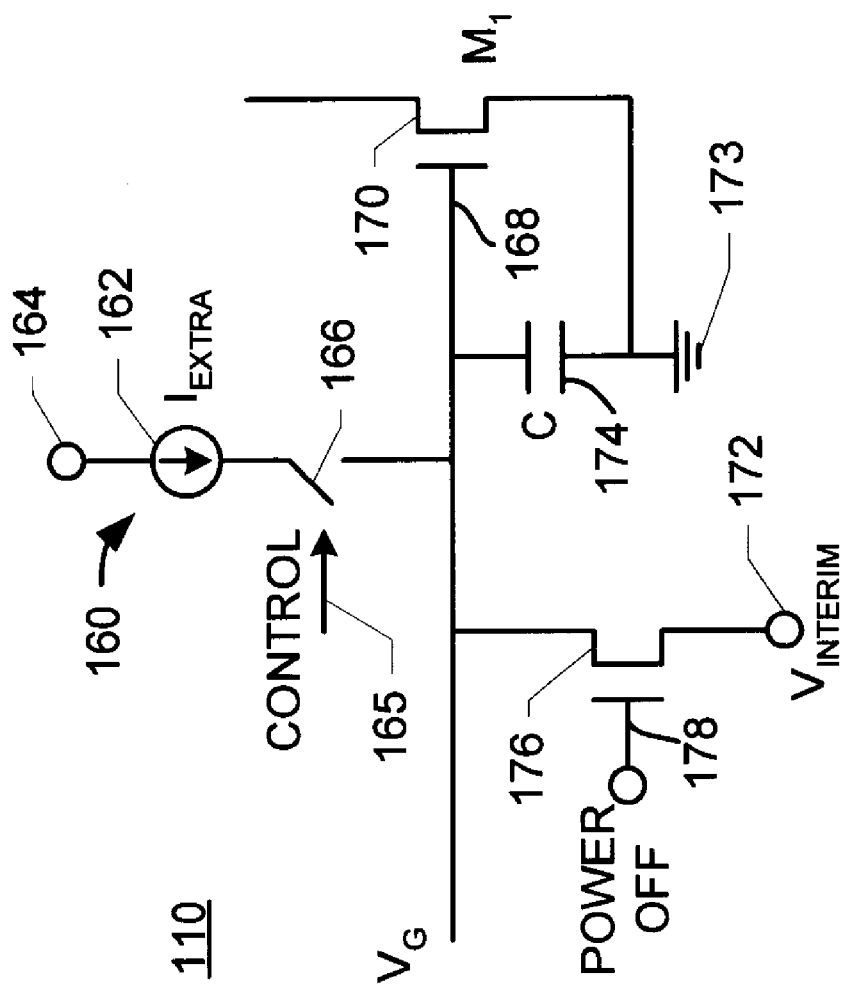
FIG. 3 is an electrical schematic diagram of details of a portion of a closed loop circuit configured according to the teachings of the present invention.

FIG. 3 is an electrical schematic diagram of details of a portion of a closed loop circuit configured according to the teachings of the present invention. In FIG. 3, a portion of a closed loop circuit 110 includes a loop switching transistor 170 having a gate locus 168 for receiving a gating voltage $V_G$. Loop switching transistor 170 is coupled between an associated device (not shown in FIG. 3; an example of such an associated device includes input switching transistors 12, 14 of differential amplifier device 10; FIG. 1) and a ground locus 173. Loop switching transistor 170 thereby controls current flow through the associated device. A capacitor 174 is coupled between gate locus 168 and ground locus 173. A shut down switching transistor 176 is coupled between gate locus 168 and a potential locus 172. Potential locus 172 is maintained at a potential $V_{INTERIM}$ that is higher than ground potential but less than the threshold gating potential at which loop switching transistor 170 begins to conduct. Shut down switching transistor 176 responds to a POWER OFF signal applied to a gate locus 178 for switchingly controlling coupling of gate locus 168 with potential locus 172.

Loop circuit 110 also includes a current injector apparatus 160. Current injector apparatus 160 includes a current source 162 coupled between a supply locus 164 and gate locus 168 via a switch 166. Switch 166 responds to an operating control signal (indicated by an arrow 165 designated "CONTROL" in FIG. 3) for effecting selective coupling of current source 162 with gate locus 168 to deliver an additional injection current $I_{EXTRA}$ to gate locus 168 when switch 166 is closed.

Either one or both of potential locus 172 and current injector apparatus 160 may be employed in practicing the present invention to advantage for reducing settling time $T_S$ without significantly affecting steady state phase margin $\Phi_M$ of loop circuit 110.

Before loop circuit 110 is initially powered up, POWER OFF signal is applied to gate locus 178 of shut down switching transistor 176 in order to establish $V_{INTERIM}$ as the initiation point for gating voltage $V_G$ for start up of loop circuit 110. This initialization of gating voltage $V_G$ at potential $V_{INTERIM}$ for start up ensures less potential is required to be added to gating voltage $V_G$ to bring gate locus 168 to its steady state operating voltage (e.g., $V_{OP}$; FIG. 2). In such manner, time to attain steady state potential at gate locus 168 at operating voltage $V_{OP}$ is reduced. For normal operation, POWER OFF is switched low which turns off shut down switching transistor device 176, thereby permitting gating voltage $V_G$ to vary from potential $V_{INTERIM}$.

Injection current $I_{EXTRA}$ causes the slope of the ramp representing change of gating voltage $V_G$ as a function of time (e.g., response curve 80; FIG. 2) to steepen or increase, thereby shortening the interval required to attain an operating potential such as $V_{OP}$.

Figure 4:
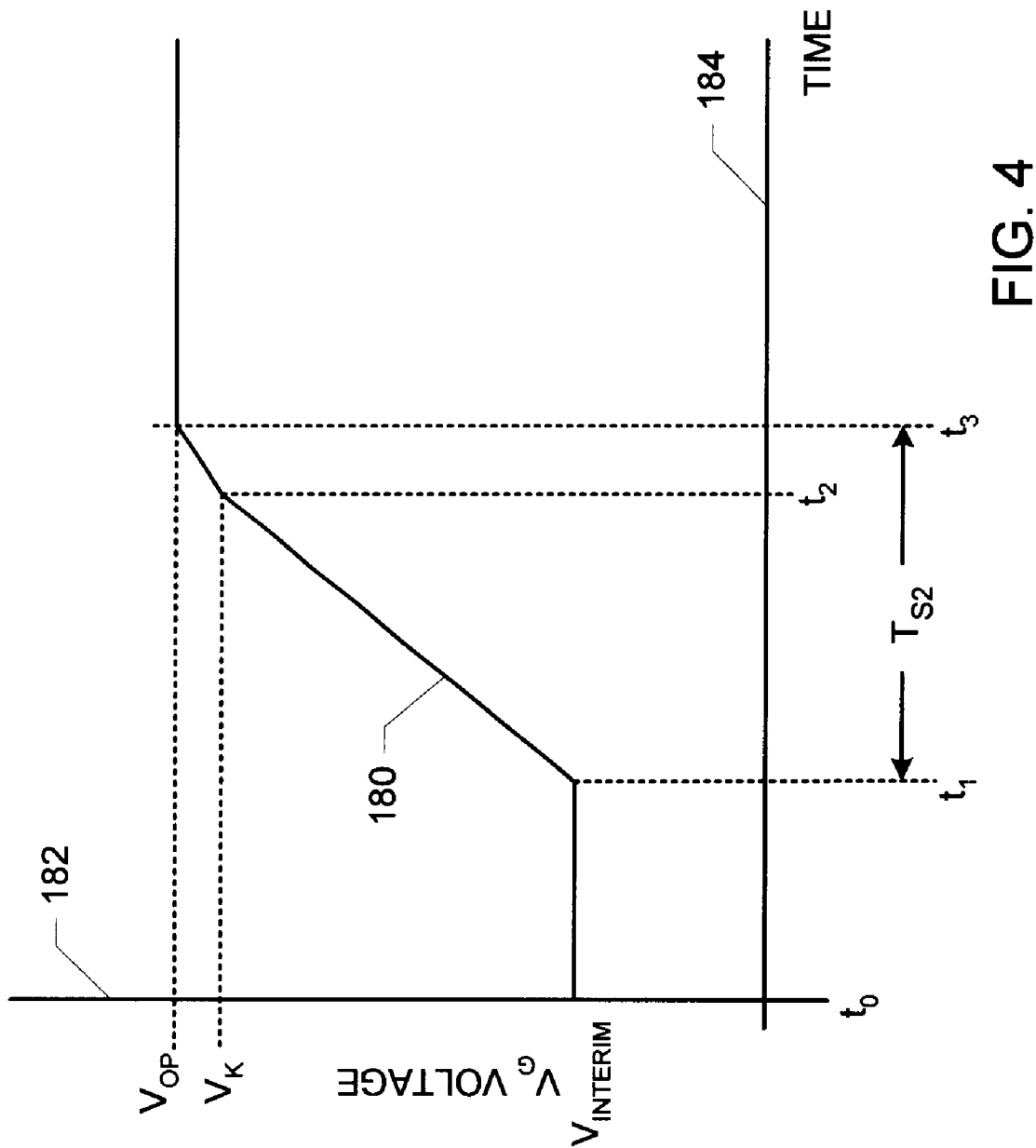
FIG. 4 is a graphical representation of gate voltage as a function of time in the closed loop circuit of FIG. 3.

FIG. 4 is a graphical representation of gate voltage as a function of time in the closed loop circuit of FIG. 3. In FIG. 4, a response curve 180 is plotted against a first axis 182, representing gate voltage $V_G$ as a function of time, represented on a second axis 184. Gate voltage $V_G$ is maintained at substantially $V_{INTERIM}$ during an interval $t_0$–$t_1$. For example, during the interval $t_0$–$t_1$, shut down switching transistor 176 is turned on and gate locus 168 is coupled with potential locus 172 (FIG. 3). At time $t_1$, shut down switching transistor 176 is turned off and gate voltage $V_G$ begins to increase. At or before time $t_1$, switch 166 (FIG. 3) may be closed and injection current $I_{EXTRA}$ may be applied to gate locus 168, thereby increasing the slope of response curve 180 during the time interval following time $t_1$. At a time $t_2$, switch 166 is opened and injection current $I_{EXTRA}$ no longer is applied to gate locus 168. At time $t_2$, gate voltage $V_G$ is at a voltage $V_K$. Response curve 180 departs from locus ($t_2$, $V_K$) toward locus ($t_3$, $V_{OP}$) during an interval $t_2$–$t_3$ at a lesser slope than was exhibited by response curve 180 during the interval $t_1$–$t_2$ when switch 166 was closed and injection $I_{EXTRA}$ was applied to gate locus 168. At time $t_3$, gate voltage $V_G$ reaches an operating voltage level $V_{OP}$ at which steady state operations are continued. The interval $t_1$–$t_3$ is the settling time $T_{S2}$ for a loop circuit such as loop circuit 110 (FIG. 3) responding as illustrated in FIG. 4.

By way of example and not by way of limitation, representative values shall be supposed for various parameters in prior art closed loop feedback circuit 20 (FIG. 1) having a response as illustrated in FIG. 2. Similarly, by way of example and not by way of limitation, and for the purpose of illustrating the advantages of the present invention over prior art circuitry representative values shall be supposed for various parameters in closed loop circuit 110 (FIG. 3) having a response as illustrated in FIG. 4. The following values are presumed for illustration:

$$V_{OP}=1.2 \text{ volts; and} \quad [3]$$

$$V_{INTERIM}=0.5 \text{ volts} \quad [4]$$

If the slope of response curve 80 (FIG. 2) during the interval $t_1$–$t_2$ is designated as $S_1$, then:

$$T_{S1} = \frac{1.2}{S_1} \quad [5]$$

If one assumes (for purposes of illustration) that injection current $I_{EXTRA}$ causes the slope of response curve 180 (FIG. 4) to be twice the slope of response curve 80 (FIG. 2), then:

$$S_2 = 2 \cdot S_1 \quad [6]$$

Further assuming that switch 166 (FIG. 3) is closed for 80% of the total duration of settling time $T_{S2}$, and that injection current $I_{EXTRA}$ is terminated (as by opening switch 166 (FIG. 3) at time $t_2$ (before the end of settling time $T_{S2}$), the steady state phase margin $\Phi_{M2}$ of loop circuit 110 (FIG. 3) is the same as the steady state phase margin $\Phi_{M1}$ of closed loop feedback circuit 20 (FIG. 1).

Employing Eqn.[5], the settling time $T_{S2}$ of response curve 180 (FIG. 4) during the interval $t_1$–$t_2$ may be mathematically described as:

$$0.8 \cdot T_{S2} = \frac{V_K - 0.5}{2 \cdot S_1} \quad [7]$$

Thus:

$$V_K - 0.5 = 1.6 \cdot S_1 \cdot T_{S2} \quad [8]$$

$$V_K = 1.6 \cdot S_1 \cdot T_{S2} + 0.5 \quad [9]$$

Employing Eqn.[5], the settling time $T_{S2}$ of response curve 180 (FIG. 4) during the interval $t_2$–$t_3$ may be mathematically described as:

$$1.2 - V_K = 0.2 \cdot T_{S2} \cdot S_1 \quad [10]$$

Thus:

$$V_K = 1.2 - 0.2 \cdot T_{S2} \cdot S_1 \quad [1]$$

Equating Eqns. [9] and [11]:

$$1.6 \cdot S_1 \cdot T_{S2} + 0.5 = 1.2 - 0.2 \cdot S_1 \cdot T_{S2} \quad [12]$$

Thus:

$$1.8 \cdot S_1 \cdot T_{S2} = 1.2 - 0.5 = 0.7 \quad [13]$$

$$T_{S2} = \frac{0.7}{1.8 S_1} = \frac{0.39}{S_1} \quad [14]$$

Eqns. [5] and [14] may be used to ascertain the relationship between settling times $T_{S1}$, $T_{S2}$:

$$\frac{T_{S2}}{T_{S1}} = \frac{\frac{0.39}{S_1}}{\frac{1.2}{S_1}} \quad [15]$$

Thus:

$$T_{S2} = 0.325 \cdot T_{S1} \quad [16]$$

And:

$$T_{S1} = 3.1 \cdot T_{S2} \quad [17]$$

Improved closed loop circuit 110 (FIG. 3) exhibits improved settling time over closed loop feedback circuit 20 (FIG. 1) by a factor of three in this example.

Figure 5:
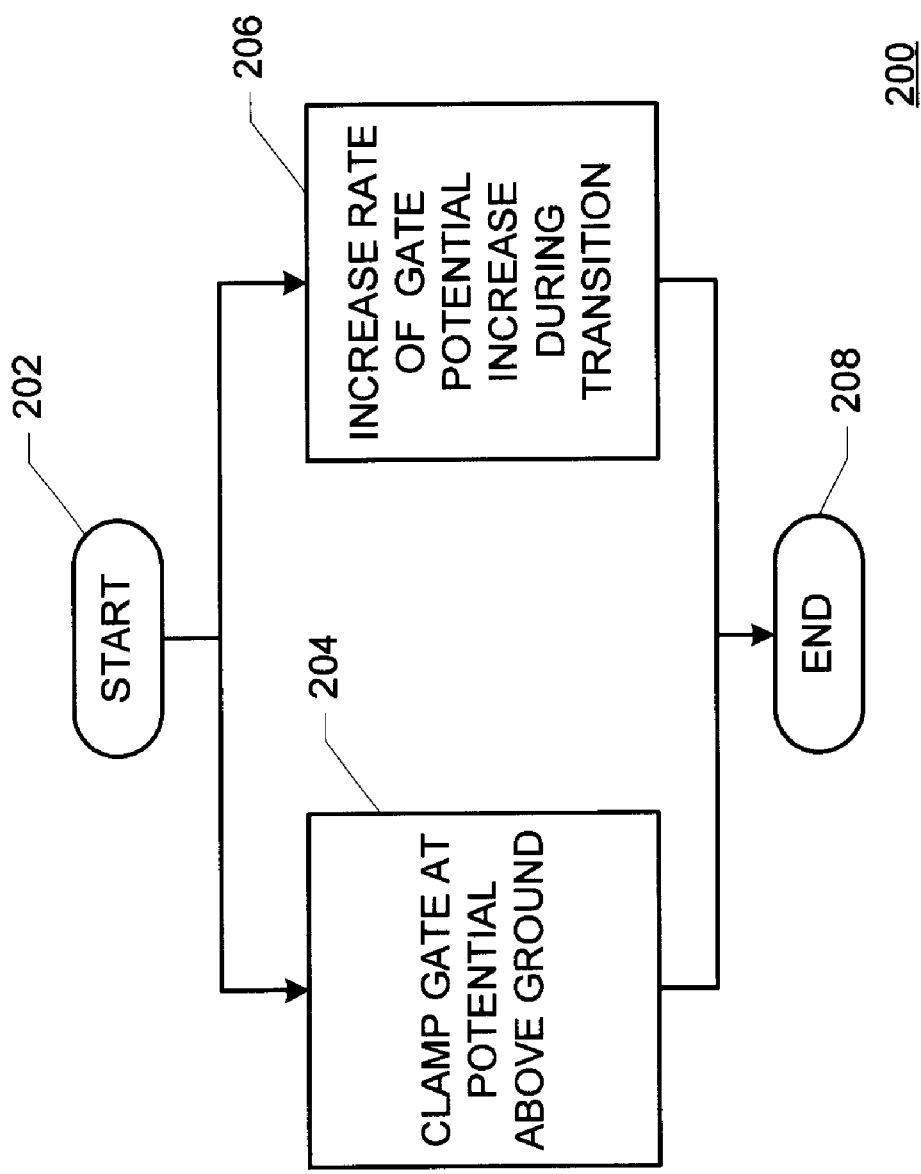
FIG. 5 is a flow diagram illustrating the method of the present invention.

FIG. 5 is a flow diagram illustrating the method of the present invention. In FIG. 5, a method 200 for affecting speed of transition of a closed loop circuit from an initial state to a steady state during a transition period begins at a START locus 202. The closed loop circuit includes a switching unit effecting the transition in response to a gating signal applied to a gate locus at a value greater than a predetermined threshold potential. Method 200 continues with the steps of: (a) at least one of: (1) clamping the gate locus at a minimum potential greater than ground potential and less than the predetermined threshold potential, as indicated by a block 204; and (2) increasing potential at the gate locus at a plurality of various rates during a plurality of segments of the transition period, as indicated by a block 206. Method 200 terminates as indicated by an END locus 208.

In a preferred embodiment, method 200 provides that the plurality of various rates comprises a first rate employed in a first segment of the plurality of segments and a second rate employed in a second segment of the plurality of segments.

Further in a preferred embodiment, method 200 provides that the first rate is a faster rate than the second rate. Still further in a preferred embodiment, method 200 provides that the first segment is of greater duration than the second segment.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. A method for affecting speed of transition of a closed loop circuit from an initial state to a steady state during a transition period; said closed loop circuit including a switching unit effecting said transition in response to a gating signal applied to a gate locus at a value greater than a predetermined threshold potential; the method comprising the steps of:

(a) at least one of:
 (1) clamping said gate locus at a minimum potential greater than ground potential and less than said predetermined threshold potential; and
 (2) increasing potential at said gate locus at a plurality of various rates during a plurality of segments of said transition period.

2. A method for affecting speed of transition of a closed loop circuit from an initial state to a steady state during a transition period as recited in claim 1 wherein said plurality of various rates comprises a first rate employed in a first segment of said plurality of segments and a second rate employed in a second segment of said plurality of segments.

3. A method for affecting speed of transition of a closed loop circuit from an initial state to a steady state during a transition period as recited in claim 2 wherein said first rate is a faster rate than said second rate.

4. A method for affecting speed of transition of a closed loop circuit from an initial state to a steady state during a transition period as recited in claim 2 wherein said first segment is of greater duration than said second segment.

5. A method for affecting speed of transition of a closed loop circuit from an initial state to a steady state during a transition period as recited in claim 3 wherein said first segment is of greater duration than said second segment.

6. An apparatus for affecting speed of transition of a closed loop circuit from an initial state to a steady state during a transition period; said closed loop circuit including a switching unit effecting said transition in response to a gating signal applied to a gate locus at a value greater than a predetermined threshold potential; the apparatus comprising:

(a) at least one of:
 (1) a clamping means coupled with said gate locus for clamping said gate locus at a minimum potential greater than ground potential and less than said predetermined threshold potential; and
 (2) a potential controlling means coupled with said gate locus for increasing potential at said gate locus at a plurality of various rates during a plurality of segments of said transition period.

7. An apparatus for affecting speed of transition of a closed loop circuit from an initial state to a steady state during a transition period as recited in claim 6 wherein said plurality of various rates comprises a first rate employed in a first segment of said plurality of segments and a second rate employed in a second segment of said plurality of segments.

8. An apparatus for affecting speed of transition of a closed loop circuit from an initial state to a steady state during a transition period as recited in claim 7 wherein said first rate is a faster rate than said second rate.

9. An apparatus for affecting speed of transition of a closed loop circuit from an initial state to a steady state during a transition period as recited in claim 7 wherein said first segment is of greater duration than said second segment.

10. An apparatus for affecting speed of transition of a closed loop circuit from an initial state to a steady state during a transition period as recited in claim 8 wherein said first segment is of greater duration than said second segment.

11. An apparatus for affecting speed of transition of a closed loop circuit from an initial state to a steady state during a transition period as recited in claim 8 wherein said potential controlling means comprises a controllable current source; said current source providing current to said gate locus at a first current level during said first segment and applying current to said gate locus at a second current level during said second segment.

12. An apparatus for affecting speed of transition of a closed loop circuit from an initial state to a steady state during a transition period as recited in claim 9 wherein said first current level is higher than said second current level.

13. An apparatus for affecting speed of transition of a closed loop circuit from an initial state to a steady state during a transition period as recited in claim 6 wherein said clamping means comprises a switch controllably connecting said gate locus with a potential source; said potential source providing said minimum potential.

* * * * *